United States Patent [19]

Hiruta

[11] Patent Number: 5,477,079
[45] Date of Patent: Dec. 19, 1995

[54] POWER SOURCE NOISE SUPPRESSING TYPE SEMICONDUCTOR DEVICE

[75] Inventor: Yoichi Hiruta, Matsudo, Japan

[73] Assignee: Kabushiki Kaisha Toshiba, Kawasaki, Japan

[21] Appl. No.: 222,000

[22] Filed: Apr. 4, 1994

Related U.S. Application Data

[63] Continuation of Ser. No. 791,170, Nov. 13, 1991, abandoned.

[30] Foreign Application Priority Data

Nov. 13, 1990 [JP] Japan ..................... 2-306449

[51] Int. Cl.$^6$ ............................. H01L 23/48; H01L 21/60
[52] U.S. Cl. ......................... 257/665; 257/735; 257/676; 257/692
[58] Field of Search ..................... 257/503, 735, 257/665, 734, 666, 676, 690, 688, 666.3, 692; 361/421

[56] References Cited

U.S. PATENT DOCUMENTS

| 4,595,945 | 6/1986 | Graver ............................ 257/666 |
| 4,612,564 | 9/1986 | Moyer ............................ 257/666 |
| 5,065,224 | 11/1991 | Fraser et al. .................... 257/666 |

FOREIGN PATENT DOCUMENTS 8605322  9/1986  WIPO.

OTHER PUBLICATIONS

Hiruta, et al., "Effects of Simultaneous Switching Noise on the Performance of a High-Speed Static Ram and its Improved Lead Frames", 1990 IEPS Conference, Reston, Va., (Abstract).

Primary Examiner—Robert P. Limanek
Assistant Examiner—David B. Hardy
Attorney, Agent, or Firm—Foley & Lardner

[57] ABSTRACT

A power source noise suppressing type semiconductor device has: a semiconductor chip formed therein with a first circuit and a second circuit, the semiconductor chip having a plurality of pads on the surface thereof, the pads including at least a first circuit pad electrically connected to the first circuit and a second circuit pad electrically connected to the second circuit; a plurality of leads including at least one power source lead, each of the plurality of leads having an inner lead and an outer lead; and a plurality of bonding wires for electrically connecting the pad to the inner lead of the lead, the first circuit pad being connected to a first connection point of the inner lead of the power source lead by a bonding wire, the second circuit pad being connected to a second connection point of the inner lead of the power source lead by a bonding wire, and the first and second connection points being spaced apart by a distance which allows the mutual inductance between the first and second connection points of the inner lead of the power source lead to become smaller than a self-inductance of the outer lead of the power source lead.

28 Claims, 7 Drawing Sheets

POWER SOURCE NOISE SUPPRESSING TYPE SEMICONDUCTOR DEVICE

This application is a continuation of application Ser. No. 07/791,170, filed Nov. 13, 1991, now abandoned.

FIELD OF THE INVENTION

The present invention relates to a power source noise suppressing type semiconductor device capable of eliminating a change in the power source potential caused by noise.

BACKGROUND OF THE INVENTION

As the operation speed becomes fast, recent semiconductor devices are now associated with a problem of malfunction caused by noise generated on a power source system. Consider as an example of semiconductor devices a resin sealed semiconductor device wherein a semiconductor chip is mounted on a bed, one end of leads disposed near at the periphery of the chip are connected to pads on the chip by bonding wires, and other end of the leads are exposed outside of the resin sealed device. In the case of a memory chip, there is formed within the chip an internal circuit such as a memory array and an external circuit such as an output buffer. In the case of a microcomputer chip, there is formed within the chip an internal circuit such as a calculation circuit and a so-called peripheral circuit such as an output buffer. In the case of a chip formed of a so-called multi-bit configuration, there has been associated malfunction of the internal circuit caused by adverse effects of a power source potential change during the operation of the external circuit. There are two types of conventional chips. In one type, as shown in FIG. 1, power is supplied from the same power source pad both to the internal and external circuits. In the other type as shown in FIGS. 2 and 3, power is supplied from different power source pads respectively to the internal and external circuits. However, in both types of conventional chips, a power source potential change at the external circuit propagates to the internal circuit.

This propagation of a power source potential change will be described with reference to FIGS. 1 to 3 in this order.

A power source potential change is likely to occur when a plurality of output buffers switch at the same time. In such a case, a potential change $\Delta V$ is given by:

$$\Delta V = NL(di/dt) \tag{1}$$

where N is the number of output buffers, L is a self-inductance of a power source system, i.e., a self-inductance of a power source line along a path from an outer lead, an inner lead, a bonding wire, and to a pad on the semiconductor chip, and $di/dt$ is a current-change rate relative to time.

There is a conventional semiconductor device which has a wiring structure such as shown in FIG. 1. Power source pads 74 are provided on a semiconductor chip 72. One of the power source pads 74 is connected to a bonding point 73 on an inner lead of a power source lead 71 by a bonding wire 75.

Assuming that N=8, L=12 nH, and $di/dt=1\times10^7$ (A/sec), it can be understood from the equation (1) that a potential change $\Delta V=0.96$ V appears at the power source pad 74 of the semiconductor device. This potential change may cause malfunction in inputting or reading data.

Taking such potential change into consideration, a recent semiconductor chip has a power source pad for driving output buffers and the like (hereinafter called external circuit power source pad) and another power source pad for driving an internal circuit (hereinafter called internal circuit power source pad), to thereby prevent malfunction of the internal circuit.

The wiring between the semiconductor chip and leads of such a semiconductor device is shown in FIG. 2. The semiconductor chip 82 has an external circuit power source pad 84a and an internal circuit power source pad 84b. A power source lead 81 is provided near at the pads 84a and 84b. At the distal area of the power source lead 81, there are formed two bonding points 83a and 83b. The bonding point 83a is connected to the external circuit power source pad 84a by a bonding wire 85a, and the bonding point 83b is connected to the internal circuit power source pad 84b by a bonding wire 85b.

There is another conventional semiconductor device having a wiring structure such as shown in FIG. 3. The distal area of a power source lead 91 is bifurcated into two inner leads 91a and 91b. A bonding point 93a is provided at the end portion of the inner lead 91a, and a bonding point 93b is provided at the end portion of the inner lead 91b. An external circuit power source pad 94a on the semiconductor chip 92 is connected to the bonding point 93a by a bonding wire 95a. An internal circuit power source pad 94b is connected to the bonding point 93b by a bonding wire 95b.

The potential change $\Delta V$ of the device shown in FIG. 2 is 0.8 V from the equation (1). This value is smaller than the value 0.96 of the device shown in FIG. 1. The reason for this is that the self-inductance L of the whole power source system is reduced to 10 nH. The self-inductance L of the power source system of the device with the bifurcated inner leads shown in FIG. 3 is reduced to 9 nH, and hence the potential change $\Delta V$ is 0.72 V.

Recent semiconductor devices use an increased number of bits in order to speed up the operation. The number N of output buffers for switching operation increases correspondingly. In order to further speed up the operation, it is necessary to enhance the driving ability of output transistors. As the driving ability is increased, the current change rate $(di/dt)$ also increases. As the values of N and $(di/dt)$ increase, the potential change $\Delta V$ will increase as seen from the equation (1), resulting in a high possibility of malfunction. With the above description in view, the conventional devices such as shown in FIGS. 2 and 3 have only a small effect of reducing the potential change $\Delta V$ and cannot sufficiently prevent malfunction.

SUMMARY OF THE INVENTION

The present invention has been made in consideration of the above circumstances. It is therefore an object of the present invention to provide a semiconductor device capable of preventing malfunction of an internal circuit of a chip by protecting the internal circuit from the influence of a power source potential change caused by the operation of an external circuit such as output buffers on the chip.

In connecting a power source lead to internal and external pads on a chip, the distance between connection points is made greater than a lead pitch. The mutual inductance of a lead between connection points is therefore reduced, considerably suppressing propagation of a potential change of an external circuit power source to an internal circuit power source.

DESCRIPTION OF THE PREFERRED EMBODIMENTS

Figure 1:
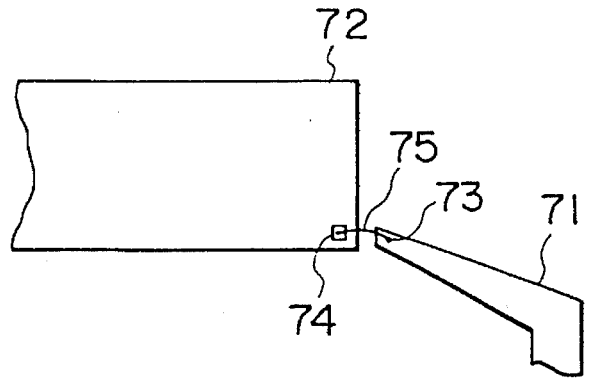
FIG. 1 is a plan view showing the main part of a convention semiconductor device.
Figure 2:
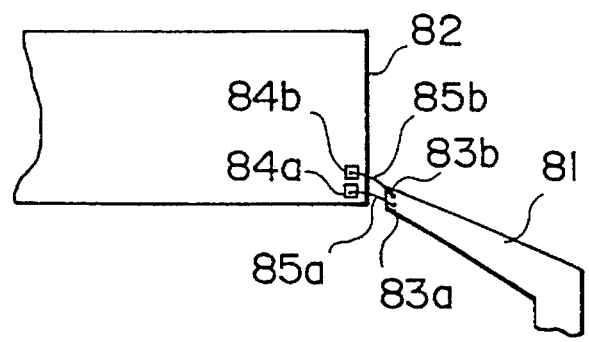
FIG. 2 is a plan view showing the main part of another conventional semiconductor device.
Figure 3:
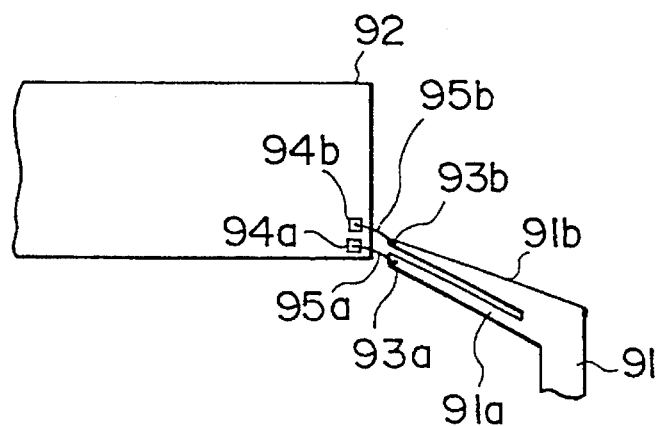
FIG. 3 is a plan view showing the main part of a further conventional semiconductor device.

The present invention has been made while considering the analysis of the first to third conventional examples shown in FIGS. 1 to 3. First, the analysis of the first to third conventional examples will be described.

In the description of the embodiments, the concept of the internal circuit and external circuit is the same as used when describing the conventional examples.

Figure 4:
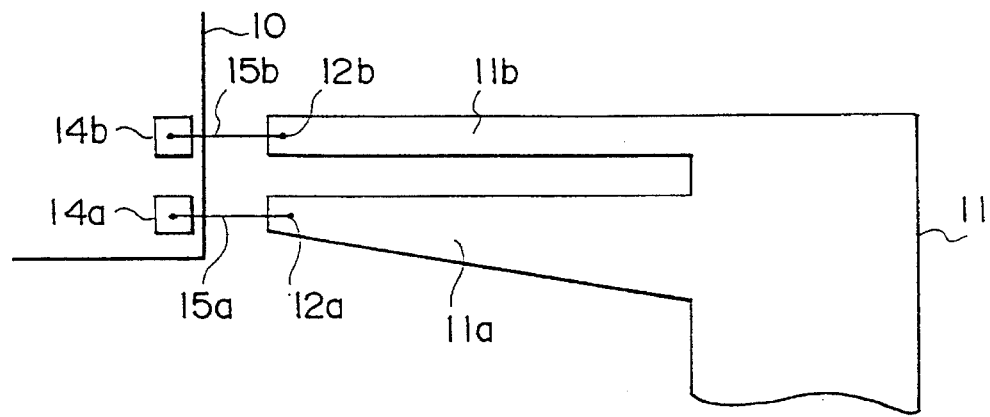
FIG. 4 is a plan view showing a model of wiring between a lead and pads on a semiconductor chip.

FIG. 4 shows a model of wiring between a semiconductor chip and a lead. The distal area of a power source lead 11 is bifurcated into two inner leads 11a and 11b. A bonding point 12a of the inner lead 11a is connected to an external circuit power source pad 14a on the chip 10 by a bonding wire 15a. A bonding point 12b of the inner lead 11b is connected to an internal circuit power source pad 14b by a bonding wire 15b.

The number of output buffers which switches at the same time is represented by N. The self-inductance of an outer lead of the power source lead is represented by L0. The self-inductance of the bonding wire 15a or 15b is represented by Lw. The self-inductance of the inner lead 11a is represented by L1. The self-inductance of the inner lead 11b is represented by L2. The mutual inductance between the inner leads 11a and 11b is represented by M. The change rate of current induced in the inner lead 11a is represented by $di_1/dt$. The change rate of current induced in the inner lead 11b is represented by $di_2/dt$. The change of potential induced on the external circuit power source pad 14a is represented by ΔV1. The change of potential induced on the internal circuit power source pad 14b is represented by ΔV2. Then, the potential change ΔV1 and ΔV2 are obtained through modification of the equation (1) by:

$$\Delta V1 = N(Lw+L1+L0)(di_1/dt) \quad (2)$$

$$\Delta V2 = N(L0+M)(di_1/dt) - (L2+Lw)(di_2/dt) \quad (3)$$

A potential change substantially the same as ΔV1 given by the equation (2) appears at the internal circuit power source pad 14b of the conventional device shown in FIG. 2, so that malfunction occurs. A potential change ΔV2 given by the equation (3) appears at the internal circuit power source pad of the conventional device shown in FIG. 3. Generally, $di_2/dt < di_1/dt$, so ΔV2 is smaller than ΔV1. A potential change of the device of FIG. 3 is more suppressed than the device of FIG. 2. However, as apparent from the equation (3), the mutual inductance between the inner leads 11a and 11b influences ΔV2. The device shown in FIG. 3 has a mutual inductance of about 4 to 6 nH which is a reason why the potential change ΔV2 cannot be made sufficiently small.

It is known that mutual inductance M is inversely proportional to the distance between two conductors. It can be understood therefore that the potential change ΔV2 appearing at the internal circuit power source pad 14b can be reduced by increasing the distance between the inner leads 11a and 11b as much as possible.

Figure 5:
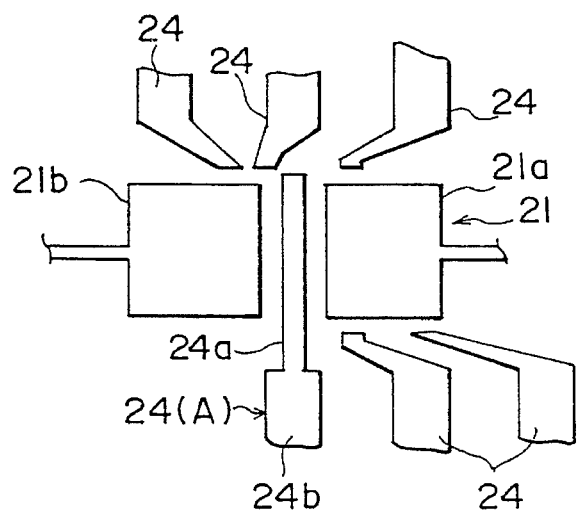
FIG. 5 is a plan view showing the main part of the lead frame used in a first embodiment of the present invention.

The present invention has been made while considering the above analysis. FIG. 5 shows the main part of a lead frame used with the semiconductor device according to the first embodiment of the present invention. A bed (lead frame) 21 on which a semiconductor chip is mounted, is divided into a first bed 21a and a second bed 21b. Leads 24, 24, . . . are radially provided around the first and second beds 21a and 21b. Of the leads 24, 24, . . . a power source lead 24(A) is disposed near the center of a chip (refer to FIG. 6) in the longitudinal direction in order to reduce the self-inductance of the lead. The inner lead 24a at the distal end portion of the power source lead 24(A) is located at the gap between the first and second beds 21a and 21b. 24b represents the outer lead of the power source lead 24(A).

Figure 6:
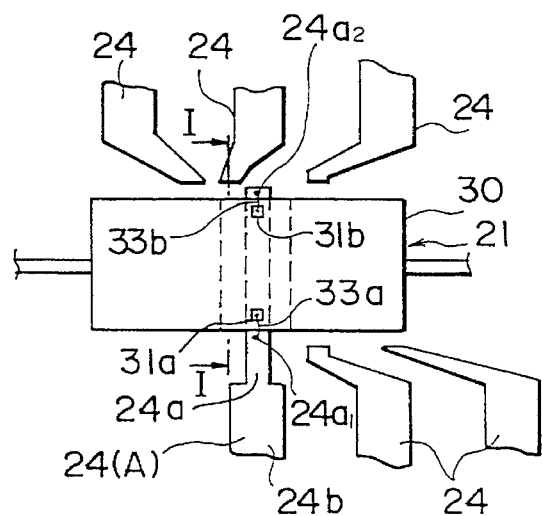
FIG. 6 is a plan view showing the main part of the first embodiment of the present invention.

Referring to FIG. 6, the semiconductor chip 30 is mounted on the lead frame 21. Specifically, the chip 30 is mounted on the first and second beds 21a and 21b, the chip being insulated from the beds by means of an insulating tape or insulating mount agent. A first bonding point $24a_1$ on the inner lead 24a of the power source lead 24(A) is connected to an external circuit power source pad 31a on the semiconductor chip 30 by a bonding wire 33a. A second bonding point $24a_2$ on the inner lead 24a is connected to an internal circuit power source pad 31b by a bonding wire 33b.

Figure 17:
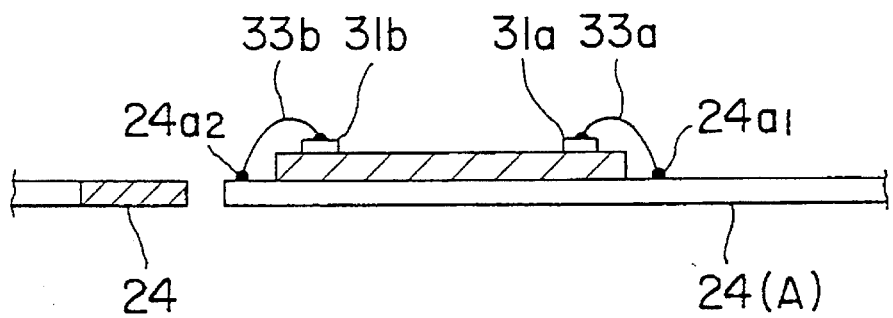
FIG. 17 is a cross section taken substantially on line I—I of FIG. 6.

In the semiconductor device shown in FIG. 6, the first bonding point $24a_1$ connected to the external circuit power source pad 31a is spaced apart, greater than the width of the semiconductor chip 30, from the second bonding point $24a_2$ connected to the internal circuit power source pad 31b. Therefore, the mutual inductance M reduces greatly so that the potential change ΔV2 induced on internal circuit power source pad 31b becomes very small. FIG. 17 shows a cross sectional view taken on line I—I of FIG. 6.

Figure 7:
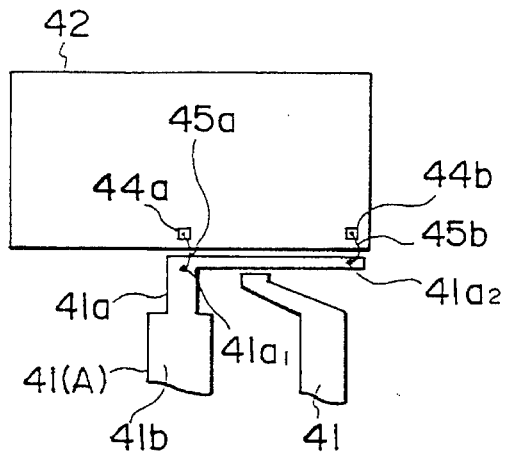
FIG. 7 is plan view showing the main part of a second embodiment of the present invention.

FIG. 7 shows the main part of the second embodiment according to the present invention. The distal portion of a power source lead 41(A) is bent at a right angle along a semiconductor chip 42. A first bonding point $41a_1$ on an inner lead 41a of the power source lead 41(A) is connected to an external circuit power source pad 44a on the semiconductor chip 42 by a bonding wire 45a. A second bonding point $41a_2$ on an inner lead 41a is connected to an internal circuit power source pad 44b by a bonding wire 45b.

Also in this second embodiment, the two bonding points $41a_1$ and $41a_2$ on the inner lead 41a are spaced apart greater than a lead pitch. Therefore, the mutual inductance M is small, and so the potential change ΔV2 can be suppressed sufficiently.

Figure 8:
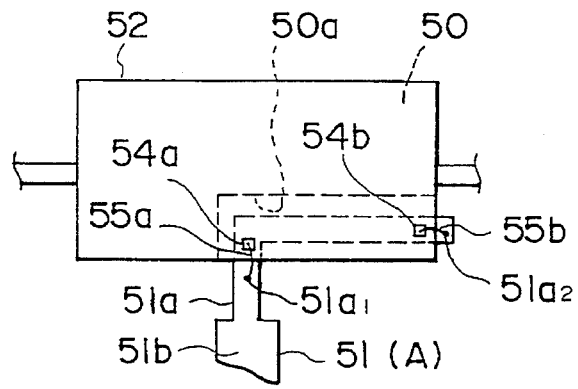
FIG. 8 is a plan view showing the main part of a third embodiment of the present invention.

FIG. 8 shows the main part of the third embodiment according to the present invention. A different point of the third embodiment from the second embodiment is that a part of an inner lead 51b of a power source lead 51(A) bent at a right angle is positioned under a semiconductor chip 52. Specifically, the chip 52 is mounted on a bed 50 having a partial recess 50a generally of an L-character shape. The inner lead 51b is placed on the recess 50a. The inner lead 51b faces the chip 52 directly, positioning up and down respectively. The distal and proximal ends of the inner lead 51a are not superposed upon the semiconductor chip 52. A first bonding point $51a_1$ on the inner lead 51a of the power source lead 51(A) is connected to an external circuit power source pad 54a by a bonding wire 55a. A second bonding point 51a at the distal area of the inner lead 51a is connected to an internal circuit power source pad 54b by a bonding wire 55b.

Also in this embodiment, the first and second bonding points $51a_1$ and $51b_2$ are spaced apart greatly. Therefore, the mutual inductance M is small, and so the potential change ΔV2 can be suppressed sufficiently.

Figure 9:
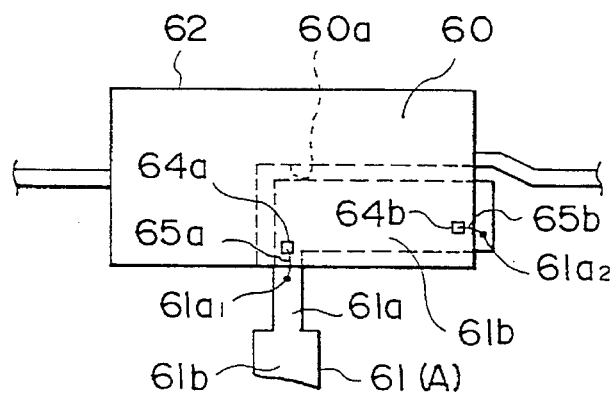
FIG. 9 is a plan view showing the main part of a fourth embodiment of the present invention.

The main part of the fourth embodiment of the present invention is shown in FIG. 9. The fundamental structure is the same as the third embodiment. A different point from the third embodiment is that the width of an inner lead 61a of a power source pad 61(A) is made wide at the area under a chip 62.

Since the inner lead 61a is made wide at the area under the chip, the self-inductance L2 is reduced.

The other structure is the same as the third embodiment. Namely, a first bonding point $61a^1$ on the inner lead 61a is connected to an external circuit power source pad 64a by a bonding wire 65a. A second bonding point $61a_2$ on the inner lead 61a is connected to an internal circuit power source pad 64b by a bonding wire 65b. Reference numeral 60 represents a bed generally of an L-character shape, and reference numeral 60a represents a recess.

Also in this embodiment, the first and second bonding points $61a_1$ and $61a_2$ are spaced apart greatly. Therefore, the mutual inductance M is small. Furthermore, the self-inductance L2 of the inner lead 61a is reduced. Therefore, the potential change ΔV2 induced on the internal circuit power source pad 64b can be suppressed greatly.

In FIGS. 7 to 9, reference numerals 41b, 51b, and 61b represent an outer lead.

According to the first to fourth embodiments of the present invention, it is possible to make the mutual inductance M smaller than 0.2 nH. Assuming that the number N of output buffers switching at the same time is 8, the self-inductance L0 of the outer lead of the power source lead is 2 nH, and the change rate di/dt of current induced on the inner lead connected to the external circuit power source pad is $1 \times 10^7$ then from the equation (3) the potential change ΔV2 at the internal circuit power source pad is about 0.16 V. In contrast with the potential change ΔV2 of 0.72 V of the conventional device shown in FIG. 3, this potential change ΔV2 of about 0.16 V is fairly small. It can be understood therefore the influence of power source potential change upon the internal circuit can be suppressed considerably.

Figure 10:
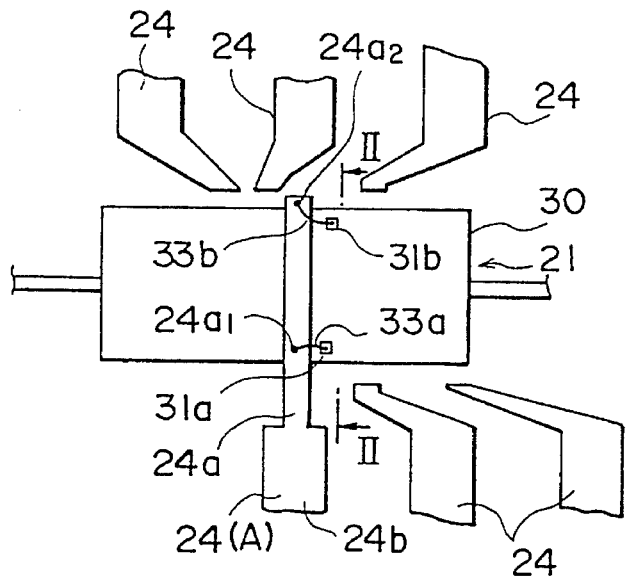
FIGS. 10 to 12 show examples of devices having power source leads above chips.
Figure 11:
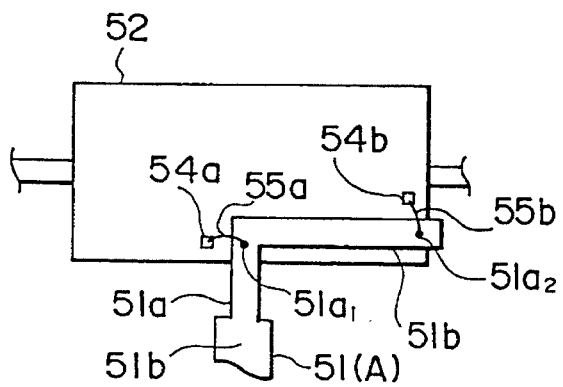
Figure 12:
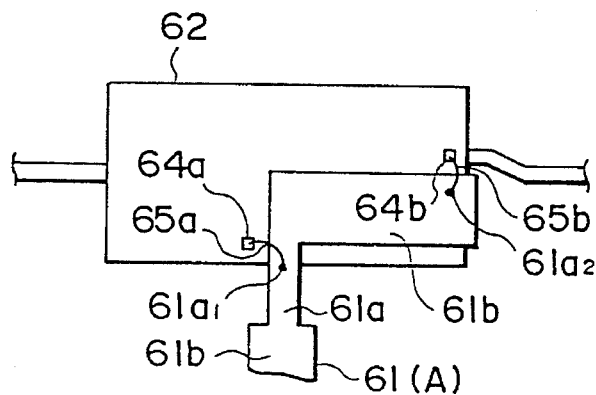
Figure 13:
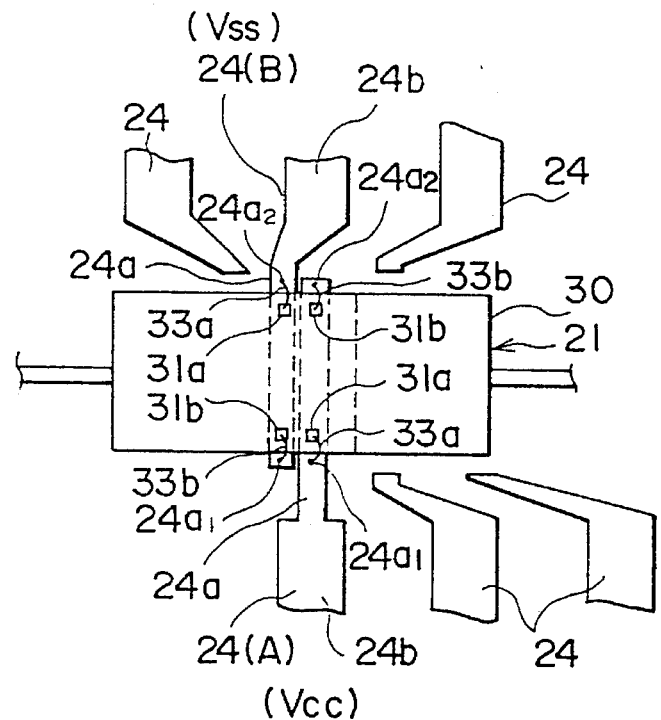
FIGS. 13 to 16 show examples of devices having power source leads of the present invention both at the high potential side ($V_{CC}$) and low potential side ($V_{SS}$)
Figure 14:
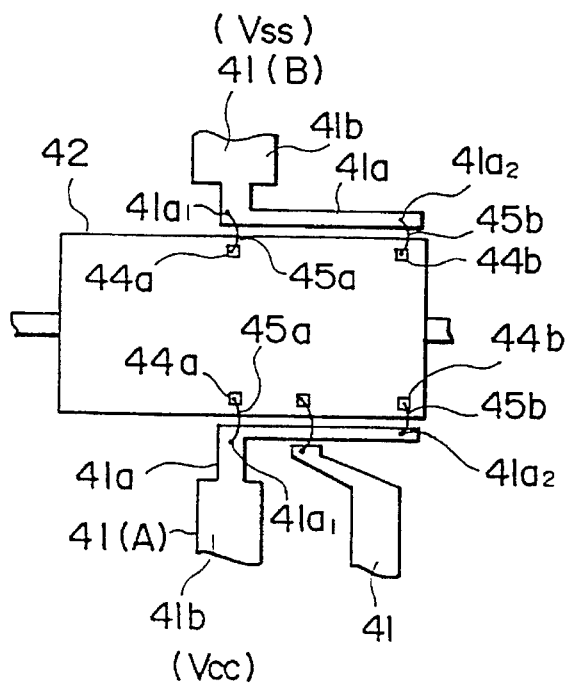
Figure 15:
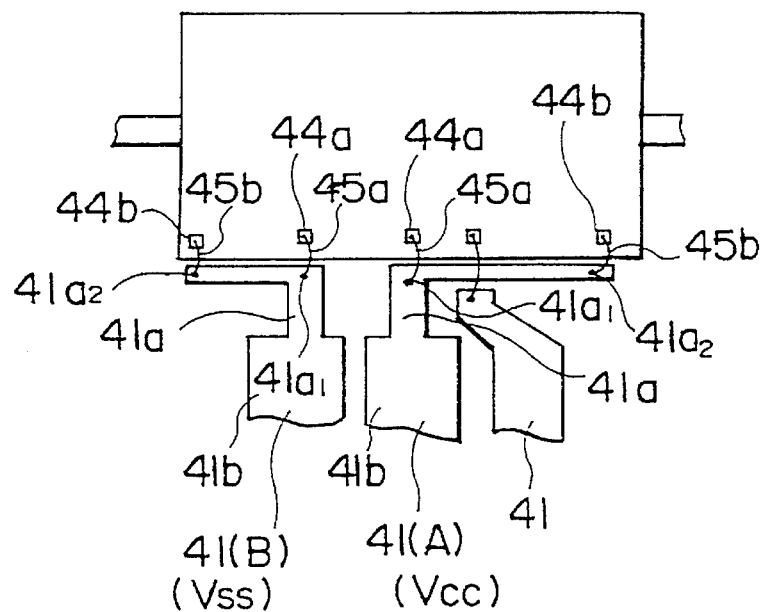
Figure 16:
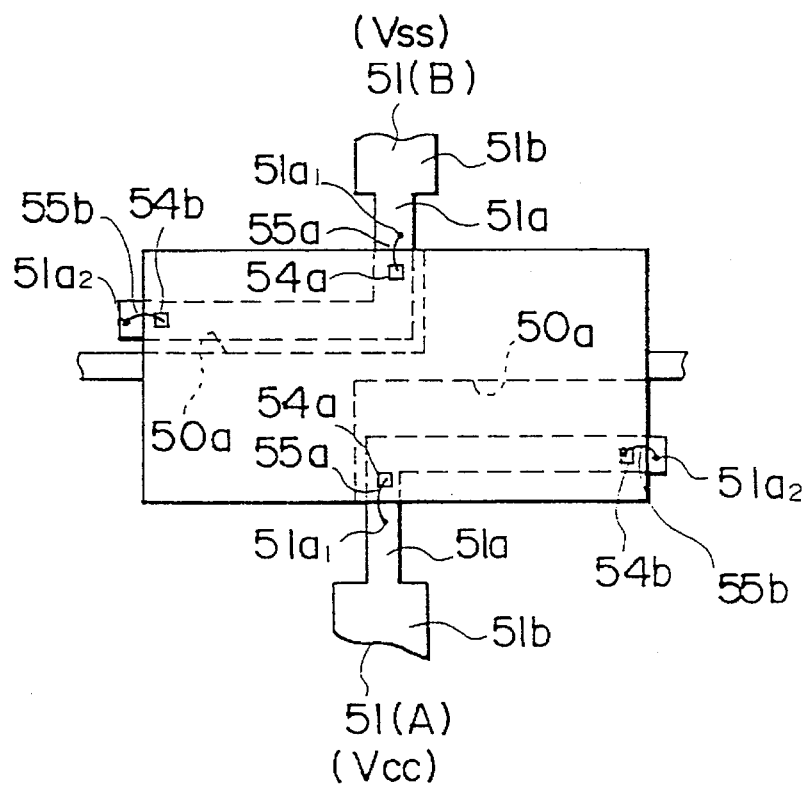
Figure 18:
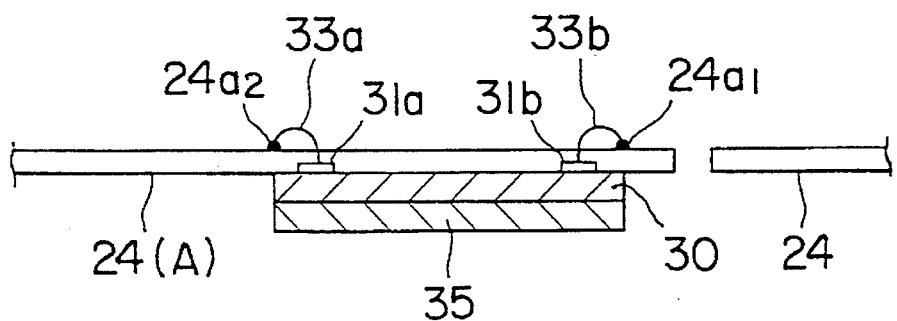
FIG. 18 is a cross section taken substantially on line II—II of FIG. 10.
Figure 19:
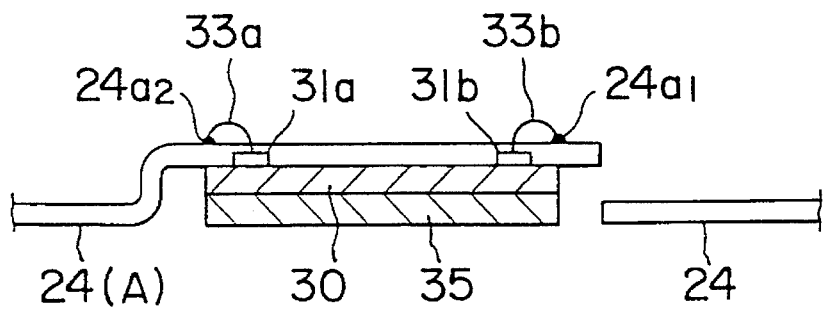
FIG. 19 is a cross section of another embodiment slightly different from that of FIG. 18.

The above-described embodiments are given by way of example only, and the present invention is not limited thereto. For example, it is sufficient if the first bonding point connected to the external circuit power source pad on a semiconductor chip is spaced apart from the second bonding point connected to the internal circuit by at least one lead pitch or more, for example, 0.5 mm or more. Alternatively, it may be arranged such that the mutual inductance at the inner lead between two bonding points is ⅒ of, or less than, the self-inductance of the outer lead. There are various shapes of a lead which satisfy such conditions, including particular shapes shown in FIG. 3 and FIGS. 7 to 9. Although the inner leads of the power source leads shown in FIGS. 6, 8 and 9 are positioned under the semiconductor chips, they may be positioned above semiconductor chips as shown in FIGS. 10 to 12. FIG. 18 shows a cross sectional view taken on line II—II of FIG. 10. FIG. 19 shows a cross sectional view of another embodiment slightly different from that of FIG. 18.

There are two types of power source leads, one being a power supply lead ($V_{CC}$) and the other being a ground lead ($V_{SS}$). The present invention is applicable to either type of power source leads, with the same advantageous effects being ensured (refer to FIGS. 13 to 16). In FIGS. 13 to 16, the present invention is applied to both the $V_{CC}$ power source lead indicated by (A) and the $V_{SS}$ power source lead indicated by (B). Specifically, a high voltage pad to the internal circuit of a chip and a high voltage pad to the external circuit are bonded to the $V_{CC}$ power source lead while ensuring a suitable space as described above. Similarly, a low voltage pad to the internal circuit and a low voltage pad to the external circuit are bonded to the $V_{SS}$ power source lead while ensuring a suitable space as described above. In a general chip, a ground lead is more likely to be influenced by noises, so that it is more effective if the present invention is applied to the ground lead. If the present invention is applied to both the power supply lead and ground lead, the influence of potential change upon the internal circuit can be suppressed more effectively.

Furthermore, in the case where an inner lead of a power source lead is connected to both the external and internal circuit power source pads on a semiconductor chip, it is preferable that the proximal point of the inner lead be connected to the external circuit power source pad and the distal point of the inner lead be connected to the internal circuit power source pad. With such an arrangement of bonding points, the influence of potential change at the external circuit power source pad upon the internal circuit power source pad can be suppressed more effectively.

What is claimed is:

1. A power source noise suppressing semiconductor device comprising:

a semiconductor chip having a surface, said semiconductor chip having a plurality of pads on the surface thereof, said pads including at least a first circuit pad and a second circuit pad, a first power source applied to said first circuit pad, a second power source applied to said second circuit pad, a voltage value of the second power source being independent of changes in a voltage value of the first power source;

a plurality of leads, including at least one power source lead, each of said plurality of leads having an inner lead and an outer lead; and a plurality of electrically connecting means for electrically connecting one of said first circuit pad and said second circuit pad to an inner lead of one of said plurality of leads, said first circuit pad being connected to a first connection point of an inner lead of said power source lead by one of said electrically connecting means, said second circuit pad being connected to a second connection point of said inner lead of said power source lead by another of said electrically connecting means, said first and second connection points being spaced apart by a distance which allows a mutual inductance between said first and second connection points of said inner lead of said power source lead to become smaller than a self-inductance of an outer lead of said power source lead, wherein said distance is set to a value which is greater than a pitch value of said plurality of leads.

2. A device according to claim 3, wherein said distance is 0.5 mm or more.

3. A device according to claim 1, wherein said distance is set such that said mutual inductance becomes $1/10$ of, or less than, said self-inductance, and wherein said inner lead of said power source lead traverses under said chip from one side of said chip to another side of said chip along the surface thereof.

4. A device according to claim 1, wherein said distance is set such that said mutual inductance becomes $1/10$ of, or less than, said self-inductance, and wherein said inner lead of said power source lead traverses above said chip from one side of said chip to another side of said chip along the surface thereof.

5. A power source noise suppressing semiconductor device comprising:

a semiconductor chip having a surface, said semiconductor chip having a plurality of pads on the surface thereof, said pads including at least a first circuit pad and a second circuit pad, a first power source applied to said first circuit pad, a second power source applied to said second circuit pad, a voltage value of the second power source being independent of changes in a voltage value of the first power source;

a plurality of leads, including at least one power source lead, each of said plurality of leads having an inner lead and an outer lead; and a plurality of electrically connecting means for electrically connecting one of said first circuit pad and said second circuit pad to an inner lead of one of said plurality of leads, said first circuit pad being connected to a first connection point of an inner lead of said power source lead by one of said electrically connecting means, said second circuit pad being connected to a second connection point of said inner lead of said power source lead by another of said electrically connecting means, said first and second connection points being spaced apart by a distance which allows a mutual inductance between said first and second connection points of said inner lead of said power source lead to become smaller than a self-inductance of an outer lead of said power source lead, wherein said first and second circuit pads are both disposed on the surface of said chip along one side of said chip, and said inner lead of said power source lead is disposed along said one side, and wherein said outer lead of said power source lead is disposed in a first direction which is substantially perpendicular to a second direction along said one side, said inner lead is bent at an angle of 90 degrees relative to said outer lead, and said inner lead is disposed between said one side of said chip and said inner lead of another of said plurality of leads.

6. A power source noise suppressing type semiconductor device comprising:

a semiconductor chip having a surface, said semiconductor chip having a plurality of pads on the surface thereof, said pads including at least a first high voltage pad and a first low voltage pad, and a second high voltage pad and a second low voltage pad, a first power source applied to said first high voltage pad and said first low voltage pad, a second power source applied to said second high voltage pad and said second low voltage pad, a voltage value of said second power source being independent of changes in a voltage value of said first power source:

a plurality of leads including at least a high voltage power source lead and a low voltage power source lead, each of said plurality of leads having an inner lead and an outer lead; and a plurality of electrically connecting means for electrically connecting one of said first high voltage pad, said first low voltage pad, said second high voltage pad and said second low voltage pad to an inner lead of one of said plurality of leads, said first and second high voltage and low voltage pads being connected respectively to first and second connection points of an inner lead of said high voltage power source lead by respective ones of said electrically connecting means, said high voltage first and second connection points being spaced apart by a distance which allows a mutual inductance between said high voltage first and second connection points of said inner lead of said high voltage power source lead to become smaller than a self-inductance of an outer lead of said high voltage power source lead, said low voltage first and second connection points being spaced apart by a distance which allows a mutual inductance between said low voltage first and second connection points of an inner lead of said low voltage power source lead to become smaller than a self-inductance of an outer lead of said low voltage power source lead, wherein said distance for each of said power source leads is set such that said mutual inductance becomes $1/10$, or less than, said self-inductance, and wherein said semiconductor chip has four sides, said first high voltage pad and said second high voltage pad are respectively disposed on the surface of said chip at a first and a second predetermined location adjacent to two opposite sides of the four sides of said chip, and said first low voltage pad and said second low voltage pad are respectively disposed on the surface of said chip at a third and a fourth predetermined location adjacent to two opposite sides of the four sides of said chip.

7. A device according to claim 6, wherein said inner leads of said high voltage power source leads are bent at an angle of 90 degrees relative to said outer leads of said high voltage power source leads, and said inner leads of said low voltage power source leads are bent at an angle of 90 degrees relative to said outer leads of said low voltage power source leads.

8. A power source noise suppressing semiconductor device connected to a first and a second power source that respectively supply a first and a second voltage value to said semiconductor device, comprising:

a semiconductor chip having a plurality of pads on a surface thereof, said pads including at least a first circuit pad and a second circuit pad, said first power source being applied to said first circuit pad, said second power source being applied to said second circuit pad, said second voltage value of said second power source being independent of changes in said first voltage value of said first power source;

a plurality of leads, including at least one power source lead, each of said plurality of leads having an inner lead and an outer lead; and a plurality of connecting means for electrically connecting one of said first circuit pad and said second circuit pad to an inner lead of one of said plurality of leads, said first circuit pad being connected to a first connection point of an inner lead of said power source lead by one of said connecting means, said second circuit pad being connected to a second connection point of said inner lead of said power source lead by another of said connecting means, and said first and second connection points being spaced apart by a distance which allows a mutual inductance between said first and second connection points of said inner lead of said power source lead to become smaller than a self-inductance of an outer lead of said power source lead, wherein said distance is set to a value which is greater than a pitch value of said plurality of leads.

9. A device according to claim 8, wherein said inner lead of said power source lead is positioned under said chip.

10. A device according to claim 8, wherein said inner lead of said power source lead is positioned above said chip.

11. A device according to claim 8, wherein said power source lead is connected to a low voltage side power source.

12. A device according to claim 8, wherein said power source lead is connected to a high voltage side power source.

13. A device according to claim 8, wherein said distance is set such that said mutual inductance is less than or equal to 1/10 of said self-inductance.

14. A device according to claim 13, wherein said inner lead of said power source lead traverses under said chip from one side of said chip to another side of said chip along the surface thereof.

15. A device according to claim 13, wherein said inner lead of said power source lead traverses above said chip from one side of said chip to another side of said chip along the surface thereof.

16. A device according to claim 8, wherein said distance is 0.5 mm or more.

17. A device according to claim 8, wherein a distance between said first connection point and said outer lead is shorter than a distance between said second connection point and said outer lead.

18. A device according to claim 8, wherein said first and second circuit pads are both disposed on the surface of said chip along one side of said chip, and said inner lead of said power source lead is disposed along said one side.

19. A device according to claim 8, wherein said first and second circuit pads are respectively disposed on the surface of said chip at a first and a second predetermined location on said chip.

20. A device according to claim 8, wherein said semiconductor chip has four sides, and wherein said first and second circuit pads are respectively disposed on the surface of said chip at a first and a second predetermined location adjacent to two different perpendicular sides of the four sides of said chip, and the inner lead of said power source lead is bent at an angle of 90 degrees relative to said outer lead of said power source lead.

21. A power source noise suppressing type semiconductor device connected to a first and a second power source that respectively supply a first and a second voltage value to said semiconductor device, comprising:

a semiconductor chip, said semiconductor chip having a plurality of pads on a surface thereof, said pads including at least a first high voltage pad and a first low voltage pad, and a second high voltage pad and a second low voltage pad, said first power source being applied to said first and second high voltage pads, said second power source being applied to said first and second low voltage pad, said second voltage value of said second power source being independent of changes in said first voltage value of said first power source;

a plurality of leads including at least a high voltage power source lead and a low voltage power source lead, each of said plurality of leads having an inner lead and an outer lead; and a plurality of connecting means for electrically connecting one of said pads to one of said inner leads of one of said leads, said first and second high voltage and low voltage pads being connected respectively to first and second connection points of said inner lead of said high voltage power source lead by respective ones of said connecting means, said high voltage first and second connection points being spaced apart by a distance which allows a mutual inductance between said high voltage first and second connection points of said inner lead of said high voltage power source lead to become smaller than a self-inductance of said outer lead of said high voltage power source lead, and said low voltage first and second connection points being spaced apart by a distance which allows a mutual inductance between said low voltage first and second connection points of said inner lead of said low voltage power source lead to become smaller than a self-inductance of said outer lead of said low voltage power source lead, said distance is set to a value which is greater than a pitch value of said leads.

22. A device according to claim 21, wherein said distance of each of said power source leads is set such that said mutual inductance is less than or equal to 1/10 of said self-inductance.

23. A device according to claim 22, wherein said semiconductor chip has four sides, and wherein said first high voltage pad and said second high voltage pad are respectively disposed on the surface of said chip at a first and a second predetermined location adjacent to two opposite sides of the four sides of said chip, and said first low voltage pad and said second low voltage pad are respectively disposed on the surface of said chip at a third and a fourth predetermined location adjacent to two opposite sides of the four sides of said chip.

24. A device according to claim 22, wherein said first high voltage and low voltage pads and said second high voltage and low voltage pads are respectively disposed on the surface of said chip along one side of said chip, and said inner leads of said high voltage and low voltage power source leads are disposed along said one side.

25. A device according to claim 22, wherein said first and second high voltage pads are respectively disposed on the surface of said chip near at a first and a second predetermined location adjacent to one side of said chip, said first and second low voltage pads are respectively disposed on the surface of said chip at a third and a fourth predetermined location adjacent to another side of said chip, and said high voltage and low voltage power source leads are disposed along said one side and said another side.

26. A device according to claim 22, wherein said semiconductor chip has four sides, and wherein said first and second high voltage pads are respectively disposed on the surface of said chip at a first and a second predetermined location adjacent to two sides thereof perpendicular to each other, an inner lead of said high voltage power source lead is bent at an angle of 90 degrees relative to an outer lead of said high voltage power source lead, said first and second low voltage pads are respectively disposed on the surface of said chip at a third and a fourth predetermined location adjacent to two sides thereof perpendicular to each other, and an inner lead of said low voltage power source lead is bent at an angle of 90 degrees relative to an outer lead of said low voltage power source lead.

27. A device according to claim 21, wherein said distance of each of said power source leads is set to a value which is greater than a pitch value of said leads.

28. A power source noise suppressing type semiconductor device connected to a first and a second power source that respectively supply a first and a second voltage value to said semiconductor device, comprising:

a semiconductor chip, said semiconductor chip having a plurality of pads on a surface thereof, said pads including at least a first high voltage pad and a first low voltage pad, and a second high voltage pad and a second low voltage pad, said first power source being applied to said first and second high voltage pad, said second power source being applied to said first and second low voltage pad, said second voltage value of said second power source being independent of changes in said first voltage value of said first power source;

a plurality of leads including at least a high voltage power source lead and a low voltage power source lead, each of said plurality of leads having an inner lead and an outer lead; and a plurality of connecting means for electrically connecting one of said pads to one of said inner leads of one of said leads, said first high voltage and low voltage pads being connected respectively to high voltage and low voltage first connection points of said inner leads of said high voltage and low voltage power source leads by respective ones of said connecting means, said second high voltage and low voltage pads being connected respectively to high voltage and low voltage second connection points of said inner leads of said low voltage and high voltage power source leads by respective ones of said connecting means, said high voltage first and second connection points being spaced apart by a distance which allows a mutual inductance between said high voltage first and second connection points of said inner lead of said high voltage power source lead to become smaller than a self-inductance of said outer lead of said high voltage power source lead, and said low voltage first and second connection points being spaced apart by a distance which allows the mutual inductance between said low voltage first and second connection points of said inner lead of said low voltage power source lead to become smaller than a self-inductance of said outer lead of said low voltage power source lead, said distance is set to a value which is greater than a pitch value of said plurality of leads.

* * * * *